United States Patent
Matsumoto et al.

(10) Patent No.: US 7,544,463 B2
(45) Date of Patent: Jun. 9, 2009

(54) PHOTOSENSITIVE STRUCTURE FOR FLEXOGRAPHIC PRINTING

(75) Inventors: Masaki Matsumoto, Fuji (JP); Hiroshi Yamada, Mishima (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 0 days.

(21) Appl. No.: 10/557,577

(22) PCT Filed: May 10, 2004

(86) PCT No.: PCT/JP2004/006245

§ 371 (c)(1),
(2), (4) Date: Nov. 21, 2005

(87) PCT Pub. No.: WO2004/104701

PCT Pub. Date: Dec. 2, 2004

(65) Prior Publication Data

US 2006/0257788 A1    Nov. 16, 2006

(30) Foreign Application Priority Data

May 23, 2003  (JP) ............................. 2003-146713

(51) Int. Cl.
G03F 7/095  (2006.01)
G03F 7/11   (2006.01)

(52) U.S. Cl. .................. 430/271.1; 430/306; 430/300; 430/286.1; 430/287.1

(58) Field of Classification Search ............... None
See application file for complete search history.

(56) References Cited

U.S. PATENT DOCUMENTS

| | | | | |
|---|---|---|---|---|
| 4,248,960 A | * | 2/1981 | Hein et al. | ........... 430/306 |
| 4,320,188 A | | 3/1982 | Heinz et al. | |
| 4,401,749 A | | 8/1983 | Hoffmann et al. | |
| 4,459,348 A | | 7/1984 | Jun et al. | |
| 4,720,448 A | * | 1/1988 | Mousseau | ........... 430/306 |
| 4,925,769 A | | 5/1990 | Huemmer et al. | |
| 5,175,072 A | * | 12/1992 | Martens | ........... 430/254 |
| 6,037,102 A | * | 3/2000 | Loerzer et al. | ........... 430/306 |

FOREIGN PATENT DOCUMENTS

| | | |
|---|---|---|
| EP | 0 055 807 A2 | 7/1982 |
| EP | 0 059 385 A2 | 9/1982 |
| EP | 0 333 012 A2 | 9/1999 |
| GB | 2270990 A * | 3/1994 |
| JP | 59-054600 | 3/1984 |
| JP | 1-296252 | 11/1989 |
| JP | 2-8849 | 1/1990 |
| JP | 2-8851 | 1/1990 |
| JP | 4-204447 | 7/1992 |
| JP | 6-214378 | 8/1994 |
| JP | 8-297369 | 11/1996 |
| JP | 2000-155410 | 6/2000 |
| JP | 2000-258898 | 9/2000 |
| JP | 2001-264959 | 9/2001 |

OTHER PUBLICATIONS

English translation, Machine generated, of JP 08-297369-A 16 pages From JPO and INPIT using dictionsre in Chemistry Natural sicence and JIS terms. Translation generated Mar. 20, 2007. from http://dossier.ipdl.ncipi.go.jp/text_trans.html and AIPN and Japan Patent Office website.*

English abstract from WPI/Thomson of JP1982016405 19820922 of which JP59054600A was one member, 1 page, year of abstract 1984, no month.Inventor Kawamoto et al.

English abstract from WPI/Thomson of JP19820164105 19820922 of which JP59054600A was one member, 1 page, year of abstract 1984 no month. Inventor Kawamoto et al.

* cited by examiner

*Primary Examiner*—Cynthia Hamilton
(74) *Attorney, Agent, or Firm*—Finnegan, Henderson, Farabow, Garrett & Dunner, L.L.P.

(57) ABSTRACT

A photosensitive structure for flexographic printing having a support (A) and, laminated thereon, an adhesive layer (B) and a photosensitive resin layer (C) different from said adhesive layer (B), wherein said adhesive layer (B) is an adhesive layer (B) comprising a thermoplastic elastomer (a) derived from at least one monovinyl substituted aromatic hydrocarbon and a conjugated diene, at least one ethylenically unsaturated compound (b) and at least one polymerization initiator (c), wherein said ethylenically unsaturated compound (b) comprises at least one (meth)acrylate (i) having one or more aromatic rings and/or one or more hydroxyl groups in the molecule thereof.

18 Claims, No Drawings

PHOTOSENSITIVE STRUCTURE FOR FLEXOGRAPHIC PRINTING

TECHNICAL FIELD

1. Incorporation by Reference

The present application claims priority based on Japanese Patent Application No. 2003-146713 filed on May 15, 2003, which is incorporated in the present application by referring the contents thereof.

2. Technical Field

The present invention relates to a photosensitive structure for flexographic printing used for making a flexographic plate and a method for production thereof.

BACKGROUND ART

An ordinary photosensitive structure for flexographic printing has a constitution wherein a polyester film is used as a support, and a photosensitive resin is laminated thereon. A method for preparing a plate from a photosensitive structure for flexographic printing adopts steps for exposing an image (relief exposure) on the surface of a photosensitive resin through a transparent image carrier (negative film), washing away unexposed portions using a solvent for the developer, and forming a desired image, i.e., a relief image, to obtain a printing plate. Furthermore, a method wherein the entire surface of a photosensitive resin is exposed to ultraviolet rays through a support (back exposure) to form a thin evenly cured layer, and then relief exposure is performed through a negative film, is also adopted. The thickness of a flexographic plate is usually 0.5 to 10 mm, and the thickness of the plate is suitably selected depending on materials to be printed and the setting of printers.

Although the obtained flexographic plate is used by fixing it on the plate cylinder of a printing machine using a double-sided adhesive tape or the like, a shear stress is produced during printing in the printing plate between the plate cylinder and the impression cylinder. When the printing plate is peeled from the support by the shear stress, a problem in that printing must be stopped or the like is caused. In addition, when the printing plate is removed from the plate cylinder after printing, the photosensitive resin may be peeled off the plate cylinder by pulling, and in such a case, the photosensitive resin and the support are undergone stress. If the support and the photosensitive resin are peeled off, the plate cannot be reused, and another plate must be prepared anew.

From such a point of view, a polyester film, which is a support, and the photosensitive resin must be firmly adhered to each other, and the adhesive strength thereof is preferably 5.9 N/cm or more when the photosensitive resin is forcibly peeled off the support at a peeling angle of 180°. Furthermore, from the viewpoint of the reuse of the plate, it is more preferable that the adhesive strength of 5.9 N/cm or more is maintained even after the photosensitive resin is processed to prepare the plate and is aged.

From such a point of view, methods for forming an adhesive layer between a support and a photosensitive resin layer are proposed in, for example, Patent Document 1 (JP-A-2000-155410) and Patent Document 2 (JP-A-2001-264959). However, in these references, there is limitation in the number of unsaturated bonds of an ethylenically unsaturated compound contained in the photosensitive resin layer, and for the photosensitive resin layer composed of a photosensitive resin composition containing no ethylenically unsaturated compounds described in these references, none of adhesive layers exhibiting a good adhesive strength are described.

In Patent Document 3 (JP-A-4-204447), a photosensitive resin relief-printing material provided with a photo-cured barrier layer to an ink-washing oil on an adhesive-treated support. However, in this case, since an adhesive layer is formed, and a barrier layer is further formed thereon, the step for preparing the photosensitive resin printing material becomes complicated.

As a material for a flexographic plate, Patent Document 4 (JP-A-1-296252) proposes the intervention of an undercoat layer between a support and an adhesive layer. Even in this case, since two layers of the undercoat layer and the adhesive layer are laminated, the step for preparing the flexographic plate material becomes complicated.

In Patent Document 5 (JP-A-2-8849) and Patent Document 6 (JP-A-2-8851), a plate composed of at least one intermediate layer formed on a support and a photosensitive relief layer formed on the intermediate layer is proposed. In these references, although polyvinyl alcohol and polyamide are shown as a binder used as the intermediate layer, a thermoplastic elastomer composed of a monovinyl substituted aromatic hydrocarbon and a conjugated diene is not described.

In Patent Document 6, although an intermediate layer that contains a specific compound is described, the specific compound is monofunctional, and no polyfunctional compounds are described. Further as the effect of the invention, improved adhesiveness and the improvement of developers are described, the resistance to ink solvents required when used as a plate is not described.

In addition, a method relating to the reuse of the rejected plate produced in the production of a flexographic plate is proposed in Patent Document 7 (JP-A-6-214378). In this document, there is described the reuse consisting of a step for isolating a recording layer from a support, a step for pulverizing the recording layer as required, and a step for adding the pulverized material to a synthetic resin mixture. However, the reuse requires a large number of steps, and has become complicated.

As described above, it is the present situation that no photosensitive structures for flexographic printing that has high adhesive strength and excels in production efficiency, and the rejected plate produced in the production process can be easily reused have been found.

Patent Document 1: JP-A-2000-155410
Patent Document 2: JP-A-2001-264959
Patent Document 3: JP-A-4-204447
Patent Document 4: JP-A-1-296252
Patent Document 5: JP-A-2-8849
Patent Document 6: JP-A-2-8851
Patent Document 7: JP-A-6-214378

DISCLOSURE OF THE INVENTION

Problems to be Solved by the Invention

An object of the present invention is to provide a photosensitive structure for flexographic printing that has a high adhesive strength and excels in production efficiency, and the rejected plate produced in the production process can be easily reused. A further object of the present invention is to provide a photosensitive structure for flexographic printing that excels in the stability of adhesive strength with time, produces no unevenness of adhesive strength in the plate, and has an adhesive layer with excellent resistance to ink solvents.

Means for Solving the Problems

The present inventors conducted keen examinations on the above-described problems, and found that the above-described problems could be solved by devising adhesive layers, and completed the present invention. Specifically, the present invention is as follows:

(1) A photosensitive structure for flexographic printing formed by laminating a support (A), an adhesive layer (B) and a photosensitive resin layer (C) different from the adhesive layer (B), wherein the adhesive layer (B) contains a thermoplastic elastomer (a) derived from at least one monovinyl substituted aromatic hydrocarbon and a conjugated diene, at least one ethylenically unsaturated compound (b) and at least one polymerization initiator (c), wherein the ethylenically unsaturated compound (b) has at least one (meth)acrylate (i) having one or more aromatic rings and/or one or more hydroxyl groups in the molecule thereof.

(2) The photosensitive structure for flexographic printing according to (1), wherein the (meth)acrylate (i) comprised by the ethylenically unsaturated compound (b) and having one or more aromatic rings and/or one or more hydroxyl groups in the molecule thereof has two or more ethylenically unsaturated groups.

(3) The photosensitive structure for flexographic printing according to (1) or (2), wherein the (meth)acrylate (i) comprised by the ethylenically unsaturated compound (b) and having one or more aromatic rings and/or one or more hydroxyl groups in the molecule thereof has a bisphenol skeleton.

(4) The photosensitive structure for flexographic printing according to any of (1) to (3), wherein the ethylenically unsaturated compound (b) contains a (meth)acrylate (i) having one or more aromatic rings and/or one or more hydroxyl groups in the molecule thereof, and a polyester (meth)acrylate (ii) having two or more ethylenically unsaturated groups in the molecule thereof.

(5) The photosensitive structure for flexographic printing according to any of (1) to (4), wherein the ethylenically unsaturated compound (b) contains a (meth)acrylate (i) having one or more aromatic rings and/or one or more hydroxyl groups in the molecule thereof, and a polyester (meth)acrylate (ii) having two or more ethylenically unsaturated groups in the molecule thereof; wherein the weight ratio (i):(ii) is 0.01:1 to 10:1.

(6) The photosensitive structure for flexographic printing according to any of (1) to (5), wherein the thickness of the adhesive layer (B) is 0.0001 to 1 mm.

(7) The photosensitive structure for flexographic printing according to any of (1) to (6), wherein the photosensitive resin layer (C) is a mixture of a thermoplastic elastomer derived from at least one monovinyl substituted aromatic hydrocarbon and a conjugated diene, at least one ethylenically unsaturated compound, and at least one polymerization initiator.

(8) The photosensitive structure for flexographic printing according to any of (1) to (7), wherein the thermoplastic elastomer (a) in the adhesive layer (B) contains a styrene-butadiene block copolymer and/or a styrene-isoprene block copolymer.

(9) The photosensitive structure for flexographic printing according to any of (1) to (8), wherein the adhesive layer (B) is partially or completely polymerized by heat energy and/or light energy.

(10) The photosensitive structure for flexographic printing according to any of (1) to (9), wherein the adhesive layer (B) contains a recovered photosensitive resin composition.

(11) The photosensitive structure for flexographic printing according to any of (1) to (10), wherein the support (A) has at least one undercoat layer on the surface of the side on which the adhesive layer (B) is laminated.

(12) The photosensitive structure for flexographic printing according to any of (1) to (11), wherein the support (A) has at least one undercoat layer, and the undercoat layer contains at least one selected from a group consisting of a composition containing a (meth)acrylate polymer or a copolymer thereof as the major component, a composition containing an aromatic polyurethane resin, obtained from a polyisocyanate containing an aromatic ring and a polyol, as the major component, and a composition containing the both as the major component.

(13) A method for preparing a photosensitive structure for flexographic printing formed by laminating a support (A), an adhesive layer (B) and a photosensitive resin layer (C) different from the adhesive layer (B), wherein the adhesive layer (B) contains a thermoplastic elastomer (a) derived from at least one monovinyl substituted aromatic hydrocarbon and a conjugated diene, at least one ethylenically unsaturated compound (b) and at least one polymerization initiator (c), wherein the ethylenically unsaturated compound (b) contains at least one (meth)acrylate (i) having one or more aromatic rings and/or one or more hydroxyl groups in the molecule thereof; the method having sequentially laminating the support (A), the adhesive layer (B) and the photosensitive resin layer.(C).

(14) The method according to (13), further having a step for laminating an adhesive layer (B) partially or completely polymerized by heat or light.

(15) The method according to (13) or (14), wherein the support (A) has at least one undercoat layer, and the undercoat layer contains at least one selected from a group consisting of a composition containing a (meth)acrylate polymer or a copolymer thereof as the major component, a composition containing an aromatic polyurethane resin obtained from a polyisocyanate containing an aromatic ring and a polyol, as the major component, and a composition containing the both as the major component.

(16) A support base material for a photosensitive structure for flexographic printing formed by providing an adhesive layer (B) on a support (A), wherein the adhesive layer (B) contains a thermoplastic elastomer (a) derived from at least one monovinyl substituted aromatic hydrocarbon and a conjugated diene, at least one ethylenically unsaturated compound (b) and at least one polymerization initiator (c), wherein the ethylenically unsaturated compound (b) contains at least one (meth)acrylate (i) having one or more aromatic rings and/or one or more hydroxyl groups in the molecule thereof.

(17) The support base material according to (16), wherein the adhesive layer (B) is partially or completely polymerized by heat energy and/or light energy.

(18) The support base material according to (16) or (17), wherein the support (A) has at least one undercoat layer on the surface of the side on which the adhesive layer (B) is laminated.

BEST MODE FOR CARRYING OUT THE INVENTION

The present invention will be specifically described below primarily referring to the preferable embodiments thereof.

As a support (A) used in the present invention, known supports can be used, and for example, a polyester film, a polyamide sheet, a metal plate or the like can be used. Preferably, a dimensionally stable polyester film having a thickness within a range between 75 and 300 μm is used. The examples of such polyester films include any aromatic polyester film, such as a polyethylene terephthalate film, a polybutylene terephthalate film, and a polyethylene naphthalate film. In order to obtain a higher adhesive strength between an adhesive layer and a polyester film support, it is more preferable to form at least one undercoat layer.

A polyester film has a layer applied to improve adhesiveness (undercoat layer), and the undercoat layer is normally applied to have a thickness of 0.001 to 1 μm. A polyester film having an undercoat layer is preferably manufactured by applying undercoat layer components onto the film continuously with the step for manufacturing a biaxially-oriented film.

The presence of the undercoat layer can be checked by known techniques, such as infrared absorption spectrometry and electron spectroscopy. Also, the presence of the undercoat layer can be checked by radiating ion beams onto the support to decompose the surface of the support, and analyzing the decomposition product.

Such films having undercoat layers are commercially available, and can be used also in the present invention. The examples of such polyester films having undercoat layers include "Lumirror T90" (trademark) series manufactured by Toray Industries, Inc., "Cosmo Shine A4000" (trademark) series manufactured by Toyobo Co., Ltd., "Tetron HPE, SG2" (trademark) manufactured by Teijin Limited, and "Melinex 700" (trademark) series manufactured by Du Pont KK.

From the point of view to obtain better adhesion, the major component that constitutes an undercoat layer is preferably a polymer of a (meth)acrylate. For example, the polymers or copolymers of methyl(meth)acrylate, ethyl(meth)acrylate, butyl(meth)acrylate, 2-ethylhexyl (meth)acrylate, or glycidyl (meth)acrylate can be used. As required, these (co)polymers can be used after copolymerizing with (meth)acrylic acid, styrene, acrylonitrile, or vinyl chloride.

Other components of the undercoat layer have preferably urethane bonds, and more preferably urethane bonds derived from an isocyanate compound having one or more aromatic rings. The examples of such compounds include a reaction product of a compound having active hydrogens and a compound having isocyanate groups. The examples of active hydrogen-containing compounds include diols, such as ethylene glycol, 1,4-butane diol, neopentyl glycol, and polyether diols thereof. Polyester compounds can also form urethane bonds since they may have active hydrogens. The examples of dicarboxylic acid components in polyester compounds include terephthalic acid and isophthalic acid; and the examples of alcohol components include ethylene glycol, 1,4-butane diol, and polyether polyol compounds thereof. Condensation products of these dicarboxylic acid components and alcohol components (diols, polyols) can be used. The examples of polyisocyanates include aromatic isocyanates, such as toluene diisocyanate and 4,4-diphenylene methane diisocyanate.

An adhesive layer (B) used in the present invention must be an adhesive layer (B) containing a thermoplastic elastomer (a) derived from at least one monovinyl substituted aromatic hydrocarbon and a conjugated diene, at least one ethylenically unsaturated compound (b) and at least one polymerization initiator (c), and the ethylenically unsaturated compound (b) has at least one (meth)acrylate (i) having one or more aromatic rings and/or one or more hydroxyl groups in the molecule thereof.

As the thermoplastic elastomer (a), commonly used polymers of a monovinyl substituted aromatic hydrocarbon and a conjugated diene monomer can be used. The examples of the monovinyl substituted aromatic hydrocarbon monomers include styrene, α-methylstyrene, p-methylstyrene, and p-methoxystyrene; and the examples of the conjugated diene monomers include butadiene and isoprene. The examples of the thermoplastic elastomers (a) include styrene-butadiene block copolymer and styrene-isoprene block copolymer. As the thermoplastic elastomer (a), these block copolymers can be used alone, or can be used in combination.

From the point of view of adhesive strength, the content of the thermoplastic elastomer (a) in the adhesive layer is preferably 20% by weight or more, more preferably 30% by weight or more, and further preferably 40% by weight or more.

The content of the ethylenically unsaturated compound (b) in the adhesive layer (B) is 1 to 20% by weight, preferably 1 to 15% by weight to the adhesive layer (B). The molecular weight of the ethylenically unsaturated compound (b) is lower than 5000, and more preferably 3000 or lower.

It is required that the ethylenically unsaturated compound (b) contains a (meth)acrylate (i) having an aromatic ring and/or a hydroxyl group in a molecule thereof.

The aromatic ring in the present invention is the generic term for rings belonging to aromatic series described in Encyclopedic Dictionary of Chemistry (published by Tokyo Kagaku Dojin Co., Ltd. in 1989). The hydroxyl group used herein is a hydroxyl group also described in Encyclopedic Dictionary of Chemistry (published by Tokyo Kagaku Dojin Co., Ltd. in 1989).

The examples of the (meth)acrylate that contains one or more aromatic rings include benzyl(meth)acrylate, phenoxyethyl(meth)acrylate, phenoxy-polyethylene glycol(meth)acrylate, an ester compound of benzoic acid, (meth)acrylic acid and another alcohol, and an addition product of a (meth)acrylate and bisphenol A.

The examples of the (meth)acrylate having one or more hydroxyl groups used in the present invention include 2-hydroxyethyl(meth)acrylate and 2-hydroxypropyl(meth)acrylate.

The examples of the (meth)acrylate containing one or more aromatic rings and/or one or more hydroxyl groups include 2-hydroxy-3-phenoxypropyl(meth)acrylate, 2-(meth)acryloyloxyethyl phthalate, 2-(meth)acryloyloxyethyl 2-hydroxyethyl phthalate, 2-(meth)acryloyloxyethyl 2-hydroxypropyl phthalate, and an addition product of a glycidyl ether and (meth)acrylic acid.

From the point of view of adhesive strength, and of the resistance to ink solvents and the stability in aging, it is preferable that (meth)acrylate (i) having an aromatic ring and/or a hydroxyl group in a molecule thereof has two or more ethylenically unsaturated groups.

Furthermore, from the point of view of adhesive strength, it is preferable that (meth)acrylate (i) having an aromatic ring and/or a hydroxyl group in a molecule thereof has a bisphenol skeleton. The bisphenol skeleton in the present invention means an aromatic dioxy compound as described in "Lecture of Plastic Material 5, Polycarbonate Resins" (M. Matsugane, S. Tahara, S. Katoh, published by Nikkan Kogyo Shimbun, Ltd. in 1969. The skeleton can be obtained by synthesis from the compound represented by the following Formula (1), and is a skeleton represented by the following Formula (2).

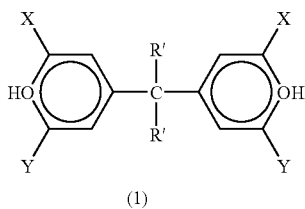

[Formula 1]

(1)

wherein R' and R" represent hydrogen, an alkane (including cycloalkane) having 1 to 6 carbon atoms, or an aromatic ring having 6 to 12 carbon atoms; and X and Y represent an alkane (including cycloalkane) having 1 to 12 carbon atoms, or a halogen.

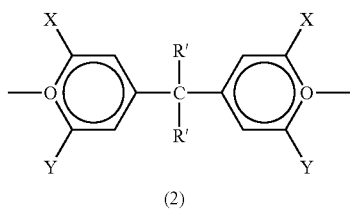

[Formula 2]

(2)

wherein R' and R" represent hydrogen, an alkane (including cycloalkane) having 1 to 12 carbon atoms, or an aromatic ring having 6 to 12 carbon atoms; and X and Y represent an alkane (including cycloalkane) having 1 to 6 carbon atoms, or a halogen.

The examples of such compounds having bisphenol skeletons include 2-mole bisphenol A propylene oxide adduct diglycidyl ether(meth)acrylic acid adduct, bisphenol A ethylene oxide adduct di(meth)acrylate, bisphenol A diglycidyl ether(meth)acrylic acid adduct, and bisphenol F ethylene oxide modified di(meth)acrylate.

From the point of view of adhesive strength, it is preferable that the ethylenically unsaturated compound (b) contains a polyester(meth)acrylate (ii) having two or more ethylenically unsaturated bonds in a molecule thereof. Such polyester (meth)acrylates, for example, 1,6-hexanediol di(meth)acrylate or 1,9-nonanediol di(meth)acrylate can be used.

A combination of more than one polyester (meth)acrylate enables adhesive strengths both between the adhesive layer and the support and between the adhesive layer and the photosensitive resin layer to be dramatically improved.

The weight ratio (i):(ii) of a polyester (meth)acrylate having two or more ethylenically unsaturated bonds in a molecule thereof (i) and (meth)acrylate having an aromatic ring and/or a hydroxyl group in a molecule thereof (ii) is 0.01:1 to 10:1, preferably 0.01:1 to 8:1, and more preferably 0.01:1 to 6:1.

From the point of view of adhesive strength, it is preferable that the (meth)acrylate (i) having an aromatic ring and/or a hydroxyl group in a molecule thereof has two or more ethylenically unsaturated groups. In this case, the characteristics of both (meth)acrylate having an aromatic ring and/or a hydroxyl group in a molecule thereof (i) and a polyester (meth)acrylate having two or more ethylenically unsaturated bonds in a molecule thereof (ii) can be satisfied. In addition, from the point of view of properties of the adhesive layer, even if (meth)acrylate having an aromatic ring and/or a hydroxyl group in a molecule thereof has two or more ethylenically unsaturated groups, it is preferable to add an ethylenically unsaturated compound having two or more ethylenically unsaturated groups but neither aromatic rings nor hydroxyl groups.

The adhesive layer (B) must contain a polymerization initiator (c). As the polymerization initiator, a photopolymerization initiator or a thermal polymerization initiator can be used. As the polymerization initiator, any known polymerization initiator can be used. From the point of view of productivity and handling, the use of a photopolymerization initiator is preferable as the polymerization initiator.

As such a photopolymerization initiator, a photopolymerization initiator commonly used in a photosensitive resin composition can be used. As such a photopolymerization initiator, for example, known radical polymerization initiator, such as aromatic ketones and benzoyl ethers can be used. For example, the radical polymerization initiator can be selected from benzophenone, Michler's ketone, benzoin methyl ether, benzoin ethyl ether, benzoin isopropyl ether, α-methylol benzoin methyl ether, and α-methoxy benzoin methyl ether, 2,2-dimethoxyphenylacetophnone, and the combination thereof can also be used. From the point of view of sensitivity to ultraviolet rays, the content of the photopolymerization initiator to the total weight of the adhesive layer is preferably 0.1 to 10% by weight, and more preferably 0.1 to 8% by weight.

In addition, a plasticizer, a sensitizer, a thermal polymerization inhibitor, colorants, dyes, pigments, fillers or a hydrophilic copolymer can be added to the adhesive layer.

The photosensitive resin layer (C) used in the present invention must be different from the adhesive layer (B). Even when the photosensitive resin layer (C) contains a binder different from the thermoplastic elastomer (a) in the adhesive layer (B), or the contents thereof are different from each other, the adhesive layer (B) is considered to be different from the photosensitive resin layer (C). Furthermore, in the present invention, even if different ethylenically unsaturated compounds or pyhotopolymerization initiators are used between the adhesive layer (B) and the photosensitive resin layer (C) as each component thereof, or the added amounts of those components are different from each other, the adhesive layer (B) is deemed to be different from the photosensitive resin layer (C). When the added amounts are different by 0.01% by weight or more, the compositions are deemed to be different. In addition, when the presence or absence, the type, or the added amount is different for the plasticizer, sensitizer, thermal polymerization inhibitor, colorants, dyes, pigments, fillers or hydrophilic copolymer, which is contained in the adhesive layer, the composition is deemed as a different composition.

The photosensitive resin layer (C) used in the present invention can be a known photosensitive resin composition.

From the point of view of printing quality and handling, as the photosensitive resin composition used in the photosensitive resin layer, it is preferable that the photosensitive resin layer (C) is a mixture of a thermoplastic elestomer composed of at least one monovinyl-substituted aromatic hydrocarbon and a conjugated diene, at least one ethylenically unsaturated compound, and at least one photopolymerization initiator.

As a thermoplastic elastomer used in the present invention, a commonly used polymer of a monovinyl-substituted aromatic hydrocarbon and a conjugated diene monomer can be used. The examples of the monovinyl-substituted aromatic hydrocarbons include styrene, α-methylstyrene, p-methylstyrene and p-methoxystyrene; and the examples of the conjugated diene monomers include butadiene and isoprene. The typical examples of the thermoplastic elastomers include a styrene-butadiene block copolymer and a styrene-isoprene block copolymer.

In order to obtain mechanical properties required for a plate, a thermoplastic elastomer having a molecular weight of 5,000 or more, preferably 10,000 or more, and more preferably 20,000 or more in the quantity of preferably 50% by weight or more, and more preferably 50 to 85% by weight, on the basis of the total weight of the photosensitive resin.

As the ethylenically unsaturated compound, a monomer commonly used in photosensitive composition can be used. For example, an ester of an alcohol, such as t-butyl alcohol and lauryl alcohol, and acrylic acid; a maleimide derivative, such as lauryl maleimide, cyclohexyl maleimide, and benzyl maleimide; a fumaric acid ester, such as dioctyl fumarate; and an ester of a polyvalent alcohol and acrylic acid or methacrylic acid, such as hexanediol(meth)acrylate, nonanediol (meth)acrylate, and trimethylol(meth)acrylate can be used alone or in combination in the photosensitive resin.

Since the quantity of the ethylenically unsaturated compound relates to the reactivity of the photosensitive resin to ultraviolet rays, the quantity is 1 to 20% by weight, and preferably 1 to 15% by weight on the basis of the total weight of the photosensitive resin. The molecular weight of the ethylenically unsaturated compound is preferably lower than 5,000, and more preferably 3,000 or lower.

As the photopolymerization initiator, a heretofore radical polymerization initiator, such as aromatic ketones and benzoyl ethers, can be used. For example, the radical polymerization initiator can be selected from benzophenone, Michler's ketone, benzoin methyl ether, benzoin ethyl ether, benzoin isopropyl ether, α-methylol benzoin methyl ether, and α-methoxy benzoin methyl ether, 2,2-dimethoxyphenylacetophnone, and the combination thereof can also be used.

From the point of view of sensitivity to ultraviolet rays, the content of the photopolymerization initiator to the total weight of the adhesive layer is preferably 0.1 to 10% by weight, and more preferably 0.1 to 8% by weight.

In addition, a plasticizer, a sensitizer, a thermal polymerization inhibitor, colorants, dyes, fillers or a hydrophilic copolymer can be added to the adhesive layer.

The above-described photosensitive resin composition can also be used as a component of the adhesive layer. When the (meth)acrylate having one or more aromatic rings and/or one or more hydroxyl groups in a molecule thereof (i) is contained in the photosensitive resin composition as an ethylenically unsaturated compound (b), the photosensitive resin composition can be used as the adhesive layer; and when it is not contained, by adding the (meth)acrylate having one or more aromatic rings and/or one or more hydroxyl groups in a molecule thereof (i), the adhesive layer can be formed. For the photosensitive resin layer used in this case, for example, a rejected plate product that may be produced in the manufacturing step can be used, and in such a case, the rejected plate product can be preferably recycled.

The recovery in the present invention means the reuse of rejected plate product that may be produced in the manufacturing step. The recovered photosensitive resin means a reused photosensitive resin when a photosensitive resin composition prepared as a photosensitive resin layer is reused at least once.

The adhesive layer (B) and the photosensitive resin layer (C) of the present invention can be prepared by various methods. For example, these can be obtained, for example, by dissolving and mixing a thermoplastic elastomer, an ethylenically unsaturated compound, a photopolymerization initiator and the like in a suitable solvent, such as chloroform and toluene, casting them in a mold form, and evaporating the solvent. Furthermore, these can be kneaded using a kneader or a roll, and formed to a desired thickness using an extruder, an injection molding machine or a press. By sequentially laminating the support (A), the adhesive layer (B) and the photosensitive resin layer (C), a photosensitive structure can be obtained.

Alternatively, a photosensitive structure can also be obtained by laminating the adhesive layer (B) on the support (A), and bonding the support (A) having the adhesive layer (B) with the photosensitive resin layer (C).

The adhesive layer (B) can also be prepared by dissolving a thermoplastic elastomer (a), an ethylenically unsaturated compound (b), and a photopolymerization initiator (c) in a suitable solvent, such as toluene and ethyl acetate, and then coating the support (A) with the solution. For coating, known methods can be used, and for example, a bar coater, a gravure coater or the like can be used.

When the adhesive layer (B) is bonded to the photosensitive resin layer (C) after laminating the adhesive layer (B) on the support (A), it is preferable to partially or completely polymerize the adhesive layer (B) from the point of view of adhesive strength. From the point of view of production efficiency, the method for polymerization is preferably photopolymerization, and the method and time for photopolymerization is not specifically limited. For example, after ultraviolet rays are radiated onto the support (A) to which the adhesive layer (B) is applied to perform polymerization reaction, the support (A) can be bonded to the photosensitive resin layer (C). Alternatively, after bonding the support (A) to which the adhesive layer (B) is applied to the photosensitive resin layer (C), ultraviolet rays can be radiated to cause polymerization.

The presence of polymerization reaction can be checked by change in solubility of the photosensitive structure for flexographic printing in a developer solvent, such as toluene and tetrachloroethylene. For example, if the adhesive layer (B) is not completely or partially dissolved when a partially or completely polymerized adhesive layer (B) is immersed in the above-described solvent, it is judged that polymerization reaction has occurred.

Furthermore, even when the adhesive layer is completely dissolved, the presence of polymerization reaction can be checked by measuring the molecule weight distribution of the adhesive layer. As the means for measuring molecule weight distribution, known analyzing techniques can be used. For example, the presence of polymerization reaction can be checked by measuring the molecule weight before and after the polymerization reaction using GPC (gel permeation chromatography).

From the adhesive layer after polymerization, the composition of the adhesive layer before polymerization can be checked. In this case, the composition of the adhesive layer before polymerization can be checked using known analyzing techniques.

By measuring the infrared absorption spectra of the polymerized adhesive, the composition of the adhesive layer can be checked. The presence of an ethylenically unsaturated compound that has not polymerized or a polymerization initiator can be checked by testing the polymerized adhesive layer using thermal decomposition gas chromatography. The presence of the initiator before polymerization can also be determined from the decomposition products of the polymerization initiator detected during the thermal decomposition gas chromatography.

In addition, the composition of the adhesive before polymerization can be checked by immersing the polymerized adhesive layer in a solvent such as chloroform to extract the ethylenically unsaturated compound that has not reacted, the polymerization initiator and the decomposition products thereof, and testing the extracts using an NMR method or a gas chromatography method.

Furthermore, the composition of the adhesive before polymerization can also be checked by radiating ion beams onto the adhesive layer to decompose the adhesive composition, and testing the decomposition products thereof.

The thickness of the adhesive layer (B) is 0.0001 to 1 mm, preferably 0.001 to 1 mm, and more preferably 0.001 to 0.5 mm.

In the support base of the present invention, an adhesive layer (B) is laminated on a support (A), and the adhesive layer (B) contains a thermoplastic elastomer (a) formed of at least one monovinyl-substituted aromatic hydrocarbon and a conjugated diene, at least one ethylenically unsaturated compound (b), and at least one polymerization initiator (c); and the adhesive layer having the ethylenically unsaturated compound (b) that contains at least one (meth)acrylate (i) having one or more aromatic rings and/or one or more hydroxyl groups in a molecule thereof is laminated on the support. The above-described adhesive layer (B) can be laminated on the support (A) using the above-described method.

The adhesive layer of the support base can be used after partially or completely polymerizing, but when polymerization reaction is performed, polymerization by photoreaction is preferable from the point of view of production efficiency. When the adhesive layer of the support base is polymerized by photoreaction, the light can be radiated from the support side, specifically in the manner that the light passes through the support; or the light can be radiated from the adhesive side, specifically without passing through the support. The presence of polymerization reaction can be checked by the above-described methods.

Since the photosensitive resin layer may have tackiness depending on the composition, a thin flexible protective film that is soluble in the developer solution can be formed in order to improve the contact with a transparent image carrier overlaid on the photosensitive resin layer in plate making, or to enable the reuse of the transparent image carrier. For example, a thin film soluble in the developer solution consisting of polyimide, alkyl cellulose, hydroxyalkyl cellulose, nitro cellulose, cellulose ester, copolymers of a monovinyl-substituted aromatic hydrocarbon and a conjugated diene, the hydrogenating reaction products of copolymers of a monovinyl-substituted aromatic hydrocarbon and a conjugated diene (for example, refer to JP-A-2002-268228) can be used.

A flexographic plate can be obtained by processing the above-described photosensitive structure for flexographic printing using an ordinary plate making method. The examples of an ultraviolet exposure source for optically curing the photosensitive resin used in the plate-making process include high-voltage mercury lamps, ultraviolet fluorescent lamps, carbon arc lamps and xenon lamps. By exposing a photosensitive resin to ultraviolet rays through a transparent image carrier, a desired image can be obtained. In order to strengthen the adhesion of the support to the photosensitive resin layer, furthermore, in order to stabilize the relief image against stress produced when washing the unexposed portions, flood exposure from the support side is effective. The exposure from the transparent image carrier side and the exposure from the support side can be performed in an optional order, also can be performed simultaneously. From the point of view of image reproducibility, it is preferable to perform the exposure from the support side first.

The examples of developer solvents used for washing the unexposed portions include chlorine-based solvents, such as 1,1,1-trichloroethane and tetrachloroethylene; esters, such as heptyl acetate and 3-methoxybutyl acetate; hydrocarbons such as petroleum distillate, toluene and decalin; and the mixtures of these solvents to which alcohols, such as propanol and butanol, are added. The washing of the unexposed portions is performed by injecting the solvent from a nozzle, of brushing using a brush. The obtained plate is cleaned by rinsing, and after drying, post exposure is performed to complete a plate.

Furthermore, a plate for laser engraving to form patterns can be fabricated by forming a layer that can be laser-engraved cured by radiating ultraviolet rays onto the entire surface of the photosensitive resin layer, and thereafter, radiating laser beams, and removing the resin in the portion exposed to the beams.

The present invention will be described in more detail on the basis of examples; however, the technical scope of the present invention is not limited to these examples.

Relating to compositions described below, parts by weight will be used unless otherwise specified.

EXAMPLES

Example 1

(1) Preparation of a Photosensitive Resin Layer

Photosensitive resin composition having the compositions shown in Table 1 were kneaded using a kneader to form photosensitive resin compositions 1 and 2. Each resultant photosensitive resin composition was sandwiched between a siliconized polyester film and a polyethylene terephthalate film having a polyamide film, and pressed using a 3-mm spacer under conditions of a temperature of 130° C. and a pressure of $1.96 \times 10^7$ Pa for 4 minutes. The thickness of the obtained photosensitive resin layer was 3.0 mm.

(2) Preparation of an Adhesive Layer

As an adhesive layer, 55 parts of styrene-butadiene copolymer (trademark "Toughprene 912", manufactured by Asahi Kasei corporation), 38 parts of paraffin oil (average carbon number: 33, average molecular weight: 470, density at 15° C.: 0.868), 2.5 parts of 1,9-nonanediol diacrylate, 1.5 parts of 2,2-dimethoxy-phenyl acetophenone, and 3 parts of Monomer 1 described in Table 2 were dissolved in toluene to form a solution of a solid content of 25%. The solution was applied onto polyester film so as to have a thickness of 100 µm using a knife coater to form an adhesive layer.

(3) Preparation of a Photosensitive Structure for Flexographic Printing

The siliconized polyethylene terephthalate film was peeled from the photosensitive resin layer and placed on a stainless steel plate heated to 130° C. to heat each layer consisting of photosensitive resins 1 and 2, respectively. The adhesive layer is laminated on the heated photosensitive resin layer so as to contact the photosensitive resin layer to fabricate a photosensitive structure.

(4) Fabrication of a Flexographic Plate and Evaluation of its Adhesive Strength

The obtained photosensitive structure was placed on "AFP-1500" (trademark, manufactured by Asahi Kasei Corporation), and image exposure of 6,000 mJ/cm$^2$ was performed through a transparent image carrier using an ultraviolet fluorescent lamp having a center wavelength at 370 nm. At this time, the exposure intensity was measured by a UV illuminance meter "MO-2" (trademark) manufactured by Orc, Inc. using a UV-35 filter. Then, the photosensitive structure was developed using "AFP-1500" developing machine (manufactured by Asahi Kasei Corporation) using a developer solution composed of tetrachloroethylene and n-butanol in a volume ratio of 3/1, dried at 60° C. for 1 hour, and undergone post exposure to obtain a flexographic plate.

In order to measure the peeling strength of the support and the photosensitive resin in the obtained flexographic plate, when the support was forcibly peeled from the sample prepared by cutting the cured resin layer into 1-cm rectangle, and the resin layer was peeled from the support using a tensile tester at an angle of 180° and a speed of 50 mm/min, the result shown in Table 3 was obtained. As Table 3 shows, a strength of 5.9 N/cm was obtained from both the photosensitive resins 1 and 2.

When printing was performed on a polyethylene film using the obtained flexographic plate with an ink containing about 15% by weight of an acetic acid ester, the cured resin was not peeled from the support due to shear stress of the plate cylinder and the impression cylinder, and furthermore, even if a large force to peel the portion of the cured resin layer by hand was applied to the cured resin layer in order to remove the plate fixed by a double-sided adhesive tape after printing, the plate did not break, and adhered tightly to the support.

In addition, when the sides of the removed flexographic plate after printing were observed, it was found that the adhesive layer was not dissolved in the solvent of the used ink, and had resistance to ink solvents.

When adhesive strength was measured after the plate after printing was aged under a condition of 20° C. for 14 days, a high adhesive strength was maintained in both photosensitive resins 1 and 2 as shown in Table 3.

Example 2

(1) Preparation of a Photosensitive Resin

In the same manner as in Example 1, each photosensitive resin layer composed of photosensitive resin composition 1 or 2, respectively, was prepared.

(2) Preparation of a Polyester Film

After the condensation reaction of 93 g of ethylene glycol, 374 g of neopentyl glycol, and 382 g of phthalic acid in an atmospheric ambience at a reaction temperature of 180° C. under a reduced pressure of $1.33 \times 10^3$ Pa for 6 hours, 125 g of 4,4-diphennylene diisocyanate was added, and further allowed to react at 80° C. for 5 hours. The resulted resin was dissolved in water to form a 10% aqueous solution, the solution was applied onto a melt-extruded polyethylene terephthalate film, and the film was biaxially oriented to obtain a polyester film having an undercoat layer. The thickness of the obtained undercoat layer was 0.05 μm.

(3) Preparation of an Adhesive Layer

As an adhesive layer, 55 parts of a styrene-butadiene copolymer ("Toughprene 912", trademark, manufactured by Asahi Kasei Corporation), 38 parts of paraffin oil (average carbon number: 33, average molecular weight: 470, density at 15° C.: 0.868), 2.5 parts of 1,9-nonanediol diacrylate, 1.5 parts of 2,2-dimethoxy-phenyl acetophenone, and 3 parts of Monomer 2 shown in Table 2 were dissolved in toluene to form a solution having 25% solid content. The solution was applied onto the polyester film obtained in (2) to a thickness of 25 μm using a knife coater to form an adhesive layer.

(4) Preparation of a Photosensitive Resin Structure

In the same manner as in Example 1, a photosensitive resin structure was prepared. Furthermore, in the same manner as in Example 1, samples for aging evaluation were also prepared.

(5) Fabrication of Flexographic Plate and Evaluation of Adhesive Strength

In the same manner as in Example 1, the plate-making process was carried out, and the adhesive strength was measured. As a result of measurement, as shown in Table 3, both photosensitive resin compositions 1 and 2 exhibited a favorable adhesive strength regardless of whether aging was performed or not. Furthermore, in the same manner as in Example 1, peeling tests by printing were also conducted, but the samples exhibited a favorable adhesive strength without being peeled off.

In addition, when the sides of the removed flexographic plate after printing were observed, it was found that the adhesive layer was not dissolved in the solvent of the used ink, and had resistance to ink solvents.

When adhesive strength was measured after the plate after printing was aged under a condition of 20° C. for 14 days, a high adhesive strength was maintained in both photosensitive resins 1 and 2 as shown in Table 3.

Example 3

(1) Preparation of a Photosensitive Resin

In the same manner as in Example 1, each photosensitive resin layer composed of photosensitive resin composition 1 or 2, respectively, was prepared.

(2) Preparation of a Polyester Film

A polyester film having an undercoat layer was prepared in the same manner as in Example 2.

(3) Preparation of an Adhesive Layer

As an adhesive layer, 18 parts of a styrene-butadiene copolymer ("Toughprene 912", trademark, manufactured by Asahi Kasei Corporation), 37 parts of styrene-isoprene copolymer ("KRATON D1112", trademark, manufactured by Kraton Polymers Japan, Ltd.), 38 parts of paraffin oil (average carbon number: 33, average molecular weight: 470, density at 15° C.: 0.868), 2.5 parts of 1,9-nonanediol diacrylate, 1.5 parts of 2,2-dimethoxy-phenyl acetophenone, and 3 parts of Monomer 1 shown in Table 2 were dissolved in toluene to form a solution having 25% solid content. The solution was applied onto the polyester film obtained in (2) to a thickness of 25 μm using a knife coater to form an adhesive layer.

A siliconized polyester film was bonded so as to contact the obtained adhesive layer, and an exposure of 50 mJ/cm² of the obtained support having an adhesive layer was performed on "AFP-1500" (trade mark, manufactured by Asahi Kasei Corporation) through a transparent image carrier using an ultraviolet fluorescent lamp having a center wavelength at 370 nm. At this time, the exposure intensity was measured by a UV illuminance meter "MO-2" (trademark) manufactured by Orc, Inc. using a UV-35 filter.

(4) Preparation of a Photosensitive Resin Structure

In the same manner as in Example 1, the siliconized polyester film was peeled from the photosensitive resin layer and the adhesive layer, and bonded so that the layers contact to each other to form a photosensitive resin structure. Also in the same manner as in Example 1, samples for aging evaluation were also prepared.

(5) Fabrication of a Flexographic Plate and Evaluation of its Adhesive Strength

In the same manner as in Example 1, the plate-making process was carried out, and the adhesive strength was measured. As a result of measurement, as shown in Table 3, both photosensitive resin compositions 1 and 2 exhibited a favorable adhesive strength. Furthermore, in the same manner as in Example 1, peeling tests by printing were also conducted, but the samples exhibited a favorable adhesive strength without being peeled off.

In addition, when the sides of the removed flexographic plate after printing were observed, it was found that the adhesive layer was not dissolved in the solvent of the used ink, and had resistance to ink solvents.

When adhesive strength was measured after the plate after printing was aged under a condition of 20° C. for 14 days, a high adhesive strength was maintained in both photosensitive resins 1 and 2 as shown in Table 3.

Example 4

(1) Preparation of a Photosensitive Resin

In the same manner as in Example 1, each photosensitive resin layer composed of photosensitive resin composition 1 or 2, respectively, was prepared.

(2) Preparation of a Polyester Film

A polyester film having an undercoat layer was prepared in the same manner as in Example 2.

(3) Preparation of an Adhesive Layer

As an adhesive layer, 22 parts of a styrene-butadiene copolymer ("Toughprene 912", trademark, manufactured by Asahi Kasei Corporation), 33 parts of styrene-isoprene copolymer ("KRATON D1112", trademark, manufactured by Kraton Polymers Japan, Ltd.), 38 parts of paraffin oil (average carbon number: 33, average molecular weight: 470, density at 15° C.: 0.868), 2.5 parts of 1,9-nonanediol diacrylate, 1.5 parts of 2,2-dimethoxy-phenyl acetophenone, and 3 parts of Monomer 3 shown in Table 2 were dissolved in toluene to form a solution having 25% solid content. The solution was applied onto the polyester film obtained in (2) to a thickness of 25 μm using a knife coater to form an adhesive layer.

(4) Preparation of a Photosensitive Resin Structure

In the same manner as in Exaple 1, a photosensitive resin structure was repared.

(5) Fabrication of Flexographic Plate and Evaluation of Adhesive Strength

In the same manner as in Example 1, the plate-making process was carried out, and the adhesive strength was measured. As a result of measurement, as shown in Table 3, both photosensitive resin compositions 1 and 2 exhibited a favorable adhesive strength. Furthermore, in the same manner as in Example 1, peeling tests by printing were also conducted, but the samples exhibited a favorable adhesive strength without being peeled off.

In addition, when the sides of the removed flexographic plate after printing were observed, it was found that the adhesive layer was not dissolved in the solvent of the used ink, and had resistance to ink solvents.

When adhesive strength was measured after the plate after printing was aged under a condition of 20° C. for 14 days, a high adhesive strength was maintained in both photosensitive resins 1 and 2 as shown in Table 3.

Example 5

(1) Preparation of a Photosensitive Resin

In the same manner as in Example 1, each photosensitive resin layer composed of photosensitive resin composition 1 or 2, respectively, was prepared.

(2) Preparation of a Polyester Film

A polyester film having an undercoat layer was prepared in the same manner as in Example 2.

(3) Preparation of Adhesive Layer

Ninety four parts of the photosensitive resin composition 1 obtained in Example 1, 3 parts of hexamethylene dimethacrylate, and 3 parts of Monomer 1 shown in Table 2 were dissolved in toluene to form a solution having 25% solid content.

The solution was applied onto a polyester film in the same manner as in Example 2 to form an adhesive layer having a thickness of 25 μm. Exposure of 50 mJ/cm$^2$ of the adhesive layer was performed in the same manner as in Example 3.

(4) Preparation of a Photosensitive Resin Structure

In the same manner as in Exaple 1, a photosensitive resin structure was repared.

(5) Fabrication of a Flexographic Plate and Evaluation of its Adhesive Strength

In the same manner as in Example 1, the plate-making process was carried out, and the adhesive strength was measured. As a result of measurement, as shown in Table 3, both photosensitive resin compositions 1 and 2 exhibited a favorable adhesive strength. Furthermore, in the same manner as in Example 1, peeling tests by printing were also conducted, but the samples exhibited a favorable adhesive strength without being peeled off.

In addition, when the sides of the removed flexographic plate after printing were observed, it was found that the adhesive layer was not dissolved in the solvent of the used ink, and had resistance to ink solvents.

When adhesive strength was measured after the plate after printing was aged under a condition of 20° C. for 14 days, a high adhesive strength was maintained in both photosensitive resins 1 and 2 as shown in Table 3.

Example 6

(1) Preparation of a Photosensitive Resin

In the same manner as in Example 1, each photosensitive resin layer composed of photosensitive resin composition 1 or 2, respectively, was prepared.

(2) Preparation of a Polyester Film

A polyester film having an undercoat layer was prepared in the same manner as in Example 2.

(3) Preparation of an Adhesive Layer

As an adhesive layer, 55 parts of a styrene-butadiene copolymer ("Toughprene 912", trademark, manufactured by Asahi Kasei Corporation), 38 parts of paraffin oil (average carbon number: 33, average molecular weight: 470, density at 15° C.: 0.868), 2.5 parts of 1,9-nonanediol diacrylate, 1.5 parts of 2,2-dimethoxy-phenyl acetophenone, and 3 parts of Monomer 4 shown in Table 2 were dissolved in toluene to form a solution having 25% solid content. The solution was applied onto the polyester film obtained in (2) to a thickness of 25 μm using a knife coater to form an adhesive layer.

(4) Preparation of a Photosensitive Resin Structure

In the same manner as in Exaple 1, a photosensitive resin structure was repared.

(5) Fabrication of a Flexographic Plate and Evaluation of its Adhesive Strength

In the same manner as in Example 1, the plate-making process was carried out, and the adhesive strength was measured. As a result of measurement, as shown in Table 3, although both photosensitive resin compositions 1 and 2 exhibited a favorable adhesive strength, unevenness in adhesive strength was observed. However, in the same manner as in Example 1, peeling tests by printing were also conducted, but the samples exhibited a favorable adhesive strength without being peeled off.

In addition, when the sides of the removed flexographic plate after printing were observed, it was found that the adhesive layer was dissolved in the solvent of the used ink although slightly.

When adhesive strength was measured after the plate after printing was aged under a condition of 20° C. for 14 days, a high adhesive strength of both photosensitive resins 1 and 2 was lower than 5.9 N/cm as shown in Table 3.

Comparative Example 1

(1) Preparation of a Photosensitive Resin

In the same manner as in Example 1, each photosensitive resin layer composed of photosensitive resin composition 1 or 2, respectively, was prepared.

(2) Preparation of an Adhesive Layer

After the condensation reaction of 624 g of neopentyl glycol, 93 g of ethylene glycol, sebacic acid and 382 g of phthalic acid in an atmospheric ambience at a reaction temperature of 180° C. under a reduced pressure of 1330 Pa for 6 hours, 87 g of trimethylene diisocyanate was added, and further allowed to react for 5 hours. To 15 parts of the resulted polyol, 1 part of xylene isocyanate was added, and dissolved in ethyl acetate to form a uniform solution, which was applied onto a polyester film in the same manner as in Example 1 to prepare a support having an adhesive layer.

(3) Preparation of a Photosensitive Resin Structure

A photosensitive-resin structure was prepared in the same manner as in Example 1.

(4) Fabrication of a Flexographic Plate and Evaluation of its Adhesive Strength

A plate-making process was carried out in the same manner as in Example 1, and adhesive strength was measured. As a result of measurement, as Table 3 shows, although favorable adhesive strength was obtained by the photosensitive resin composition 1, the adhesive strength was insufficient in the photosensitive resin layer 2.

Furthermore, when a printing test was conducted in the same manner as in Example 1 and the adhesive strength was measured, the photosensitive resin 1 exhibited a favorable adhesive strength without being peeled off. On the other hand, in the case of the photosensitive resin 2, when the flexographic plate was peeled from the support after printing, the detachment of the photosensitive resin layer from the support occurred. For the photosensitive resin 1, when aging was performed in the same manner as in Example 1 to evaluate the adhesive strength, a favorable adhesive strength was exhibited also after aging.

For the photosensitive resin 2, since it was peeled from the photosensitive resin layer when the flexographic plate was peeled from the plate cylinder, no samples for the aging test could be obtained to evaluate aging.

When the sides of the removed flexographic plate of the photosensitive resin 1 after printing were observed, it was found that the adhesive layer was not dissolved in the solvent of the used ink, and had resistance to ink solvents.

For the photosensitive resin 2, since the photosensitive resin was peeled off when the plate was removed from the plate cylinder, the adhesive layer became unclear, and therefore resistance to ink solvents remained unknown.

Comparative Example 2

(1) Preparation of Photosensitive Resin

In the same manner as in Example 1, each photosensitive resin layer composed of photosensitive resin composition 1 or 2, respectively, was prepared.

(2) Preparation of Adhesive Layer

An adhesive layer was prepared in the same manner as in Example 1 except that the Monomer 1 was excluded from the adhesive layer of Example 1.

(3) Preparation of a Photosensitive Resin Structure

A photosensitive resin structure was prepared in the same manner as in Example 1.

(4) Fabrication of a Flexographic Plate and Evaluation of its Adhesive Strength

A plate-making process was carried out in the same manner as in Example 1, and adhesive strength was measured. As a result of measurement, as Table 3 shows, both photosensitive-resin compositions 1 and 2 had insufficient adhesive strength.

Furthermore, when a printing test was conducted in the same manner as in Example 1 and the adhesive strength was measured, detachment of the photosensitive resin layer from the support occurred for both photosensitive resins 1 and 2 when the flexographic plate was peeled from the plate cylinder.

For both photosensitive resins 1 and 2, since the photosensitive resin layer was detached when the flexographic plate was peeled from the plate cylinder, no samples for the aging test could be obtained to evaluate aging.

Since both photosensitive resins 1 and 2 were detached when the plate derived from each of them was removed from the plate cylinder, the adhesive layer became unclear, and therefore resistance to ink solvents remained unknown.

Comparative Example 3

(1) Preparation of a Photosensitive Resin

In the same manner as in Example 1, each photosensitive resin layer composed of photosensitive resin composition 1 or 2, respectively, was prepared.

(2) Preparation of Adhesive Layer

Ninety parts of a thermoplastic polyamide ("Macromelt 6900", trademark, manufactured by Henkel Japan Corporation), 4 parts of 1,9-nonanediol diacrylate, 2 parts of 2,2-dimethoxy-phenyl acetone, and 4 parts of the Monomer 4 shown in Table 2 were dissolved in a 1:1 (ratio by weight) mixed solution of toluene and isopropyl alcohol to form a solution having a concentration by weight of 25%.

Using this solution, in the same manner as in Example 1, an adhesive layer of a thickness of 25 μm was formed on a polyester film. Ultraviolet rays of 50 mJ/cm$^2$ were radiated onto the polyester film in the same manner as in Example 3.

(3) Preparation of a Photosensitive Resin Structure

In the same manner as in Example 1, a photosensitive resin structure was prepared.

(4) Fabrication of a Flexographic Plate and Evaluation of its Adhesive Strength

A plate-making process was carried out in the same manner as in Example 1, and adhesive strength was measured. As a result of measurement, as Table 3 shows, both photosensitive resin compositions 1 and 2 had insufficient adhesive strength.

Furthermore, when a printing test was conducted in the same manner as in Example 1 and the adhesive strength was measured, detachment of the photosensitive resin layer from the support occurred for both photosensitive resins 1 and 2 when the flexographic plate was peeled from the plate cylinder.

For both photosensitive resins 1 and 2, since the photosensitive resin layer was detached when the flexographic plate was peeled from the plate cylinder, no samples for the aging test could be obtained to evaluate aging.

Since both photosensitive resins 1 and 2 were detached when the plate derived from each of them was removed from the plate cylinder, the adhesive layer became unclear, and therefore resistance to ink solvents remained unknown.

TABLE 1

| Components of photosensitive resin composition | Photosensitive resin 1 (part by weight) | Photosensitive resin 2 (part by weight) |
|---|---|---|
| Toughprene A (styrene-butadiene block copolymer from Asahi Kasei Corporation) | 60 | 60 |
| B-2000 (liquid polybutadiene from Nippon Petrochemicals Co., Ltd.) | 30 | 30 |
| 1,9-Nonanediol diacrylate | 7 | |
| Dioctyl fumarate | | 5 |
| Lauryl maleimide | | 2 |
| 2,2-Dimethoxy-phenyl acetophenone | 2 | 2 |
| 2,6-di-t-butyl-p-cresol | 1 | 1 |

TABLE 2

| | Chemical formula |
|---|---|
| Monomer 1 | {CH$_2$CH—CO—O—CH$_2$CH(OH)CH$_2$—O—CH(CH$_3$)O—⟨C$_6$H$_4$⟩$_2$—C(CH$_3$)$_2$ |
| Monomer 2 | {CH$_2$C(CH$_3$)—CO—O—CH$_2$CH(OH)CH$_2$—O—CH(CH$_3$)O—⟨C$_6$H$_4$⟩$_2$—C(CH$_3$)$_2$ |
| Monomer 3 | {CH$_2$CH—CO—O—CH$_2$CH(OH)CH$_2$—O—⟨C$_6$H$_4$⟩$_2$—C(CH$_3$)$_2$ |
| Monomer 4 | CH$_2$CH—CO—O—CH$_2$CH(OH)CH$_2$—O—⟨C$_6$H$_5$⟩ |

TABLE 3

| | Adhesiveness to photosensitive resin 1 (N/cm) | Adhesiveness to photosensitive resin 1 after aging[*1] (N/cm) | Adhesiveness to photosensitive resin 2 (N/cm) | Adhesiveness to photosensitive resin 2 after aging[*1] (N/cm) |
|---|---|---|---|---|
| Example 1 | 5.9 | 6.0 | 5.9 | 5.9 |
| Example 2 | 9.8 | 9.7 | 9.8 | 9.8 |
| Example 3 | 14.7 | 14.2 | 11.8 | 11.6 |
| Example 4 | No detachment | No detachment | 11.8 | 11.8 |
| Example 5 | 7.8 | 7.9 | 7.8 | 7.8 |
| Example 6 | 9.8, 5.9[*2] | 3.9 | 9.8, 6.2[*2] | 4.0 |
| Comparative Example 1 | 10.8 | 10.8 | 1.0 | Cannot be measured[*3] |
| Comparative Example 2 | 1.0 | Cannot be measured[*3] | 1.0 | Cannot be measured[*3] |
| Comparative Example 3 | 0.1 | Cannot be measured[*3] | 0.1 | Cannot be measured[*3] |

[*1] The printing plate undergone the adhesive strength evaluation test using a printer was further subjected to aging at 20° C. for 14 days to evaluate the adhesive strength.
[*2] Since adhesive strengths became uneven depending on the location of measurement, the adhesive strength at each location was recorded.
[*3] Since the photosensitive resin was peeled off from the support when the flexographic plate was peeled from the plate cylinder, the samples to be aged could not be prepared, and measurement could not be performed.

INDUSTRIAL APPLICABILITY

According to the present invention, there can be provided a photosensitive structure for flexographic printing that has a high adhesive strength and excels in production efficiency, and the rejected plate produced in the production process can be easily reused.

The invention claimed is:

1. A photosensitive structure for flexographic printing comprising a laminate of a support (A), an adhesive layer (B) above said support (A) and a photosensitive resin layer (C) above said adhesive layer (B) which is different from said adhesive layer (B), wherein said adhesive layer (B) has a thickness of from 0.0001 to 1 mm and comprises a thermoplastic elastomer (a) derived from at least one monovinyl substituted aromatic hydrocarbon and a conjugated diene, at least one ethylenically unsaturated compound (b) and at least one polymerization initiator (c), wherein said ethylenically unsaturated compound (b) comprises at least one (meth)acrylate (i) having one or more aromatic rings and one or more hydroxyl groups in the molecule thereof, and wherein said photosensitive resin layer (C) can be cured by ultraviolet exposure.

2. The photosensitive structure for flexographic printing according to claim 1, wherein said (meth)acrylate (i) comprised of said ethylenically unsaturated compound (b) and having one or more aromatic rings and one or more hydroxyl groups in the molecule thereof has two or more ethylenically unsaturated groups.

3. The photosensitive structure for flexographic printing according to claim 1 or 2, wherein said (meth)acrylate (i) comprised of said ethylenically unsaturated compound (b) and having one or more aromatic rings and one or more hydroxyl groups in the molecule thereof has a bisphenol skeleton.

4. The photosensitive structure for flexographic printing according to claim 1 or 2, wherein said ethylenically unsaturated compound (b) comprises said (meth)acrylate (i) and a polyester(meth)acrylate (ii) having two or more ethylenically unsaturated groups in the molecule thereof.

5. The photosensitive structure for flexographic printing according to claim 4, wherein said ethylenically unsaturated compound (b) comprises said (meth)acrylate (i) and a polyester(meth)acrylate (ii) having two or more ethylenically unsaturated groups in the molecule thereof, wherein the weight ratio (i):(ii) is 0.01:1 to 10:1.

6. The photosensitive structure for flexographic printing according to claim 1 or 2, wherein said photosensitive resin layer (C) is a mixture of a thermoplastic elastomer derived from at least one monovinyl substituted aromatic hydrocarbon and a conjugated diene, at least one ethylenically unsaturated compound, and at least one polymerization initiator.

7. The photosensitive structure for flexographic printing according to claim 1 or 2, wherein said thermoplastic elastomer (a) in the adhesive layer (B) comprises a styrene-butadiene block copolymer and/or a styrene-isoprene block copolymer.

8. The photosensitive structure for flexographic printing according to claim 1 or 2, wherein said adhesive layer (B) is partially or completely polymerized by heat energy and/or light energy.

9. The photosensitive structure for flexographic printing according to claim 1 or 2, wherein said adhesive layer (B) contains a recovered photosensitive resin composition.

10. The photosensitive structure for flexographic printing according to claim 1 or 2, wherein said support (A) has at least one undercoat layer on the surface of the side on which said adhesive layer (B) is laminated.

11. The photosensitive structure for flexographic printing according to claim 10, wherein said undercoat layer comprises at least one selected from the group consisting of a composition containing a (meth)acrylate polymer or a copolymer thereof as a major component, a composition containing an aromatic polyurethane resin obtained from a polyisocyanate containing an aromatic ring and a polyol, as a major component, and a composition containing both as a major component.

12. A method for preparing a photosensitive structure for flexographic printing comprising the steps of forming a support (A), forming an adhesive layer (B) above said support (A) and forming a photosensitive resin layer (C) above said adhesive layer (B) which is different from said adhesive layer (B), wherein said adhesive layer (B) has a thickness of from 0.0001 to 1 mm and comprises a thermoplastic elastomer (a) derived from at least one monovinyl substituted aromatic hydrocarbon and a conjugated diene, at least one ethylenically unsaturated compound (b) and at least one polymerization initiator (c), wherein said ethylenically unsaturated compound (b) comprises at least one (meth)acrylate (i) having one or more aromatic rings and one or more hydroxyl groups in the molecule thereof, and sequentially laminating said support (A), said adhesive layer (B) and said photosensitive resin layer (C), and wherein said photosensitive resin layer (C) can be cured by ultraviolet exposure.

13. The method according to claim 12, further comprising laminating an adhesive layer (B) that is partially or completely polymerized by heat or light.

14. The method according to claim 12 or 13, wherein said support (A) has at least one undercoat layer on the surface of the side on which said adhesive layer (B) is formed, and said undercoat layer contains at least one selected from the group consisting of a composition containing a (meth)acrylate polymer or a copolymer thereof as a major component, a composition containing an aromatic polyurethane resin obtained from a polyisocyanate containing an aromatic ring and a polyol, as a major component, and a composition containing both as a major component.

15. A support base material for a photosensitive structure for flexographic printing formed by providing an adhesive layer (B) on a support (A), wherein said adhesive layer (B) has a thickness of from 0.0001 to 1 mm and comprises a thermoplastic elastomer (a) derived from at least one monovinyl substituted aromatic hydrocarbon and a conjugated diene, at least one ethylenically unsaturated compound (b) and at least one polymerization initiator (c), wherein said ethylenically unsaturated compound (b) comprises at least one (meth)acrylate (i) having one or more aromatic rings and one or more hydroxyl groups in the molecule thereof, and wherein said adhesive layer (B) is partially or completely polymerized by heat energy and/or light energy.

16. The support base material according to claim 15, wherein said support (A) has at least one undercoat layer on the surface of the side on which said adhesive layer (B) is provided.

17. A photosensitive structure for flexographic printing comprising a laminate of a support (A), an adhesive layer (B) above said support (A) and a photosensitive resin layer (C) above said adhesive layer (B) which is different from said adhesive layer (B), wherein said adhesive layer (B) comprises a thermoplastic elastomer (a) derived from at least one monovinyl substituted aromatic hydrocarbon and a conjugated diene, at least one ethylenically unsaturated compound (b) and at least one polymerization initiator (c), wherein said ethylenically unsaturated compound (b) comprises at least one (meth)acrylate (i) having one or more aromatic rings and one or more hydroxyl groups in the molecule thereof and wherein said support (A) has at least one undercoat layer on the surface of the side on which said adhesive layer (B) is laminated, said undercoat layer comprising at least one selected from the group consisting of a composition containing a (meth)acrylate polymer or a copolymer thereof as a major component, a composition containing an aromatic polyurethane resin obtained from a polyisocyanate containing an aromatic ring and a polyol, as a major component, and a composition containing both as a major component.

18. A method for preparing a photosensitive structure for flexographic printing comprising the steps of forming a support (A), forming an adhesive layer (B) above said support (A) and forming a photosensitive resin layer (C) above said adhesive layer (B) which is different from said adhesive layer (B), wherein said adhesive layer (B) comprises a thermoplastic elastomer (a) derived from at least one monovinyl substituted aromatic hydrocarbon and a conjugated diene, at least one ethylenically unsaturated compound (b) and at least one polymerization initiator (c), wherein said ethylenically unsaturated compound (b) comprises at least one (meth)acrylate (i) having one or more aromatic rings and one or more hydroxyl groups in the molecule thereof, and sequentially laminating said support (A), said adhesive layer (B) and said photosensitive resin layer (C), and wherein said support (A) has at least one undercoat layer, and said undercoat layer contains at least one selected from the group consisting of a composition containing a (meth)acrylate polymer or a copolymer thereof as a major component, a composition containing an aromatic polyurethane resin obtained from a polyisocyanate containing an aromatic ring and a polyol, as a major component, and a composition containing both as a major component.

* * * * *